(12) United States Patent
Doong et al.

(10) Patent No.: US 6,396,751 B1
(45) Date of Patent: May 28, 2002

(54) SEMICONDUCTOR DEVICE COMPRISING A TEST STRUCTURE

(75) Inventors: Yih-Yuh Doong, Kaohsiung; Tsu-bin Shen, Taipei Hsien; Sung Chun Hsieh, Taipei; Chien-Jung Wang, Hsinchu Hsien, all of (TW)

(73) Assignee: Taiwan Semiconductor Manufacturing Corporation, LTD, Hsinchu (TW)

( * ) Notice: Subject to any disclaimer, the term of this patent is extended or adjusted under 35 U.S.C. 154(b) by 0 days.

(21) Appl. No.: 09/755,547

(22) Filed: Jan. 5, 2001

(51) Int. Cl.$^7$ .................................................. G11C 7/00
(52) U.S. Cl. .............. 365/201; 365/230.04; 365/230.06
(58) Field of Search ................................. 365/201, 200, 365/214, 230.04, 230.06

(56) References Cited

U.S. PATENT DOCUMENTS 5,371,712 A * 12/1994 Oguchi et al. ......... 365/230.06
6,046,926 A * 4/2000 Tanaka et al. .............. 365/145

* cited by examiner

Primary Examiner—Richard Elms
Assistant Examiner—Hien Nguyen
(74) Attorney, Agent, or Firm—Blakely Sokoloff Taylor & Zafman, LLP

(57) ABSTRACT

A semiconductor memory device comprising a test structure is disclosed. The semiconductor device includes a plurality of memory cells, word lines, bit lines, and test pads; the word lines including a first set and a second set of word lines, connected to a first and second word line test pad, respectively; the bit lines including a first set and a second set of bit lines, connected to a first and second bit line test pad, respectively. The first set of word lines and the first set of bit lines access a first set of memory cells, the first set of word lines and the second set of bit lines access a second set of memory cells, the second set of word lines and the first set of bit lines access a third set of memory cells, and the second set of word lines and the second set of bit lines access a fourth set of memory cells. By applying a predetermined set of test signals to the first and second word line test pads, and the first and second bit line test pads, the disturbance or interference among the first, second, third, and fourth set of memory cells can be measured.

9 Claims, 1 Drawing Sheet

SEMICONDUCTOR DEVICE COMPRISING A TEST STRUCTURE

FIELD OF THE INVENTION

The present invention relates to a semiconductor memory device, and more particularly, to a semiconductor memory device incorporating a test circuit, and a method of operation thereof.

BACKGROUND OF THE INVENTION

A semiconductor memory device comprises of millions of memory cells tightly packed in an array on a semiconductor substrate. To ensure the quality of a memory device, various tests must be conducted on the memory cells in order to detect defective products prior to their shipments. Because the number of memory cells within a device is enormous, a preliminary test is typically performed on all memory cells to determine whether any cell is defective. If all of the memory cells pass the preliminary test, then no further tests need to be conducted. For example, a current leakage test is conducted on all cells, and if no usual leakage current is detected, then there is no need to test the memory cells individually for leakage current. But if a large leakage current is detected, it may indicate that the memory device has at least one defective cell. Further tests are required to determine which memory cell is defective and whether it can be cured.

A test circuit that implements such preliminary testing may include a first test pad connected to all word lines and a second test pad connected to all bit lines. By applying test signals to the first and second test pad, all of the memory cells can be tested at the same time. Typically, the test circuits are built in the scribe line of the wafer. Such test structure can measure the electrical characteristics of memory cells to determine if the device is defective, but because the same signal is applied to all the cells, interference between neighboring cells cannot be detected.

The present invention is directed to an improved testing structure so that different groups of memory cells can be tested, and defects related to interaction between neighboring memory cells can be detected, thus allowing improvement of manufacturing process in an efficient manner.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing.

DETAILED DESCRIPTION OF THE PREFERRED EMBODIMENT

Figure 1:
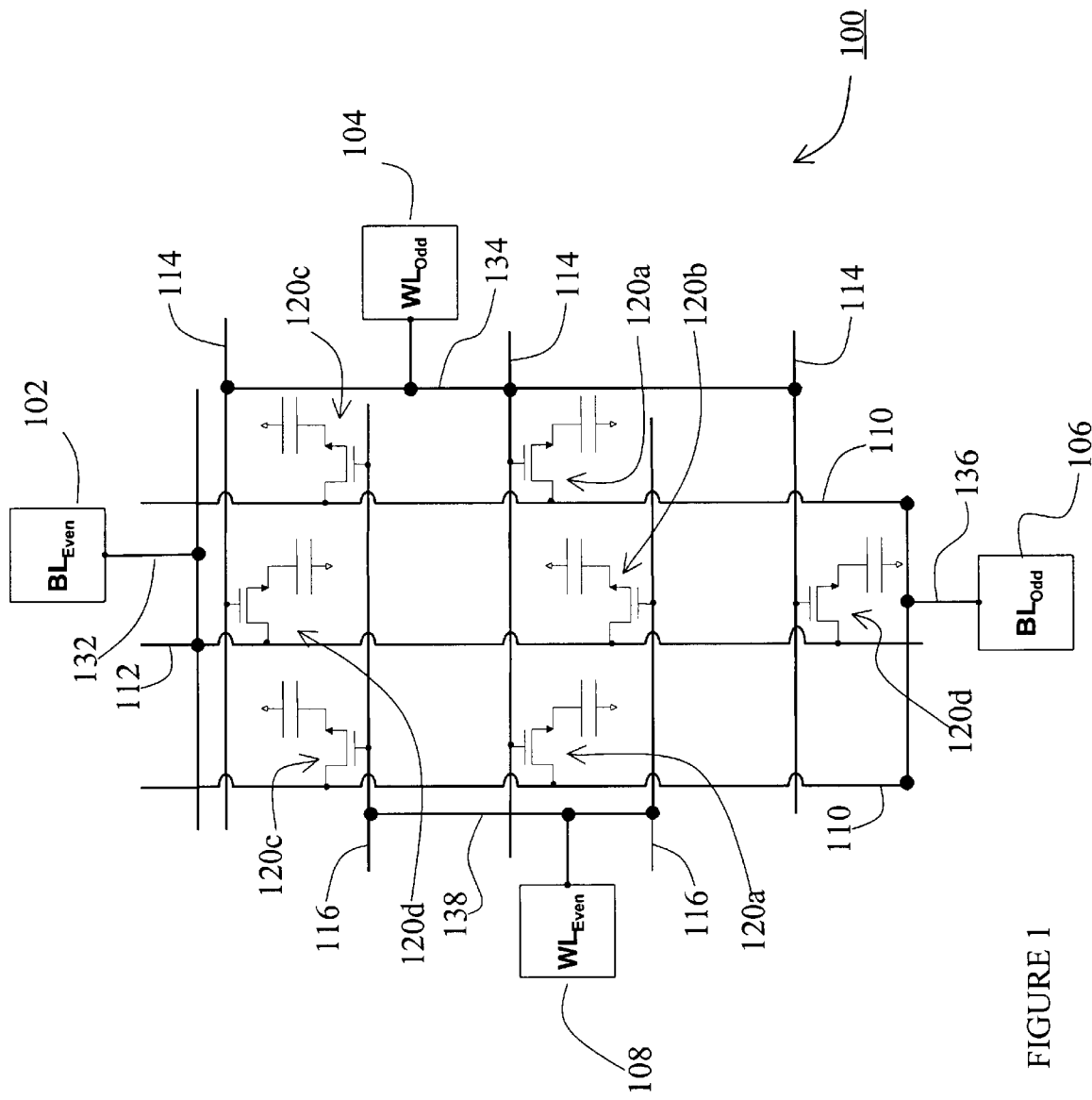
FIG. 1 shows a memory device with test structure in accordance with the invention.

A semiconductor memory device comprising a test structure is disclosed. The semiconductor device includes a set of memory cells, a first set of word lines connected to a first word line test pad, a second set of word lines connected to a second word line test pad, a first set of bit lines connected to a first bit line test pad, a second set of bit lines connected to a second bit line test pad; the first and second set of word lines and the first and second set of bit lines cooperatively accessing a first, a second, a third, and a fourth subset of memory cells; whereby applying a predetermined set of test signals to the first and second word line test pads, and the first and second bit line test pads, the disturbance or interference among the first, second, third, and fourth subset of memory cells can be measured.

Referring to FIG. 1, a semiconductor memory device 100 comprises memory cells 120, word lines 114 and 116, and bit lines 110 and 112. Each memory cell 120 comprises an access transistor and a storage capacitor. A BL__even test pad 102 is connected to the even-numbered bit lines 112 via connection line 132. A BL__odd test pad 106 is connected to the odd-numbered bit lines 110 via connection line 136. A WL__odd test pad 104 is connected to the odd-numbered word lines 114 via connection line 134. A WL__even test pad 108 is connected to the even-numbered word lines 116 via connection line 138. For clarity of illustration, only a few memory cells, bit lines and word lines are shown. In actual implementation, there are millions of memory cells formed in an array on the substrate with thousands of word lines and bit lines running alongside these memory cells. Each word line is also connected to a word line address decoder (not shown in the figure), and each bit line is also connected to a bit line address decoder (not shown in the figure). The word/bit line address decoders allow individual memory cells to be accessed in a read/write operation, as is well know in the art.

Preferably, a test circuit is connected to the test pads 102, 104, 106, and 108. The test circuit generates test signals in order to measure the functionality of the memory cells connected to the test pads. The test signals also allow measurement of the interaction (disturbance or interference) among memory cells connected to different test pads. Typically, the test circuit, the test pads, and the connection lines that connect the word/bit lines to the test pads are situated on the scribe lines of a wafer.

When WL__odd test pad 104 and BL__odd test pad 106 are both pulled high, the memory cell 120a, and other memory cells connected to both the odd word lines 114 and odd bit lines 110 are pulled high. The functionality of these memory cells can be tested by measuring the electrical characteristics of the cell. Likewise, when WL__even test pad 108 and BL__even test pad 102 are both pulled high, the memory cell 120b, and other memory cells connected to both the even word lines 116 and even bit lines 112 are pulled high. The functionality of these memory cells can be tested accordingly. When WL__even test pad 108 and BL__odd test pad 106 are both high, the memory cell 120c, and other memory cells connected to both the even word lines 116 and odd bit lines 136 are pulled high. The functionality of these memory cells can be tested accordingly. When WL__odd test pad 104 and BL__even test pad 102 are both high, the memory cell 120d, and other memory cells connected to both the odd word lines 110 and even bit lines 112 are pulled high. The functionality of these memory cells can be tested accordingly.

TABLE 1

| Test pattern # | Cell 102a | Cell 102b | Cell 102d |
| --- | --- | --- | --- |
| 1 | L | H | L |
| 2 | L | H | H |
| 3 | H | H | L |
| 4 | H | L | H |
| 5 | H | L | L |
| 6 | L | L | H |

The interference, or disturbance, of a memory cell by another memory cell or memory cells can be measured by using the test signal pattern shown in Table 1. In test pattern 1, memory cell 102b is pulled high, while memory cells 102a and 102d are kept low. The leakage current from memory cell 102b to memory cells 102a and 102d can then be measured. In test pattern 2, memory cells 102b and 102d are pulled high, while memory cell 102a are kept low. The leakage current from memory cell 102b to memory cell 102a can then be measured. In test pattern 3, memory cells 102*a* and 102*b* are pulled high, while memory cell 102*d* are kept low. The leakage current from memory cell 102*b* to memory cell 102*d* can then be measured. Test patterns 4 can be used to measure the leakage current from memory cells 102*a* and 102*d* to memory cell 102*b*. Test pattern 5 can be used to measure the leakage current from memory cell 102*a* to memory cell 102*b*. Test pattern 6 can be used to measure the leakage current from memory cell 102*d* to memory cell 102*b*. The test patterns in Table 1 are not exhaustive, and are used for illustrative purposes only.

In another embodiment of the present invention, the word lines are grouped into three sets. The word lines with the sequence number {3, 6, 9,..., 3i} (i being an integer) are connected together to one test pad. The word lines {1, 4, 7, . . . , 3i+1} are connected to a second test pad. The word lines {2, 5, 8, . . . , 3i+2} are connected to a third test pads. Likewise, the bit lines with sequence number {3, 6, 9, . . . , 3i} are connected together to a fourth test pad. The bit lines {1, 4, 7, . . . , 3i+1} are connected to a fifth test pad. The bit lines {2, 5, 8, . . . , 3i+2} are connected to a sixth test pads. Together, these six test pads can be used to access 9 different groups of memory cells. By properly designing test signals, the disturbance or interference among the 9 groups of memory cells may be measured.

By measuring the disturbance or interference between neighboring cells, a process engineer can determine which parts of the device have problems, such as the isolation structure between memory cells 120*a* and 120*b*, etc., and adjust the manufacturing process and equipment accordingly to improve yield rate.

While the preferred embodiment of the invention has been illustrated and described, it will be appreciated that various changes can be made therein without departing from the spirit and scope of the invention.

We claim:

1. A semiconductor device formed on a silicon substrate, comprising:

a plurality of cells formed on the substrate;

a plurality of word lines formed on the substrate, said plurality of word lines being sequentially numbered, the odd-numbered word lines being electrically coupled to a first word line test pad, and the even-numbered word lines being electrically coupled to a second word line test pad; and a plurality of bit lines formed on the substrate, the plurality of bit lines being sequentially numbered, the odd-numbered bit lines being electrically coupled to a first bit line test pad, and the even-numbered bit lines being electrically coupled to a second bit line test pad;

wherein said odd-numbered word lines and said odd numbered bit lines access a first group of cells, said odd-numbered word lines and said even-numbered bit lines access a second group of cells, said even-numbered word lines and said odd-numbered bit lines access a third group of cells, and said even-numbered word lines and said even-numbered bit lines access a fourth group of cells;

whereby applying a predetermined set of test signals to said first word line test pad, said second word line test pad, said first bit line test pad, and said second bit line test pad, interference among said first, second, third, and fourth group of cells can be measured.

2. The semiconductor device of claim 1, wherein the cells are memory cells.

3. The semiconductor device of claim 1, wherein the interaction between said first group of cells with said second, third, and fourth group of cells can be measured by performing the following steps:

applying a logic low voltage signal to said first word line test pad, said second word line test pad, and said second bit line test pad;

applying a logic high voltage signal to said first word line test pad and said first bit line test pad; and measuring the electrical characteristics of said first group of cells.

4. A semiconductor device formed on a silicon substrate, comprising:

a plurality of cells formed on the substrate;

a first set of word lines formed on the substrate and electrically connected to a first word line test pad;

a second set of word lines formed on the substrate and electrically connected to a second word line test pad;

a first set of bit lines formed on the substrate and electrically connected to a first bit line test pad;

a second set of bit lines formed on the substrate and electrically connected to a second bit line test pad;

wherein said first set of word lines and said first set of bit lines access a first set of cells, said first set of word lines and said second set of bit lines access a second set of cells, said second set of word lines and said first set of bit lines access a third set of cells, and said second set of word lines and said second set of bit lines access a fourth set of cells;

whereby applying a predetermined set of test signals to said first word line test pad, said second word line test pad, said first bit line test pad, and said second bit line test pad, interference among said first, second, third, and fourth set of cells can be measured.

5. The semiconductor device of claim 4, wherein said cells are memory cells.

6. The semiconductor device of claim 4, wherein said semiconductor device is tested to measure the effect of said second, third, and fourth set of cells on said first set of cells, by:

applying a logic low voltage signal to said first word line test pad, said second word line test pad, and said second bit line test pad;

applying a logic high voltage signal to said first word line test pad and said first bit line test pad; and measuring the electrical characteristics of said first set of cells.

7. The semiconductor device of claim 4, wherein said semiconductor device is tested to measure the effect of said second, third, and fourth set of cells on said first set of cells, by:

applying a logic high voltage signal to said first word line test pad, said second word line test pad, and said second bit line test pad;

applying a logic low voltage signal to said first word line test pad and said first bit line test pad; and measuring the electrical characteristics of said first set of cells.

8. The semiconductor device of claim 5, wherein said first set of word lines and said second set of word lines are alternately disposed on the substrate, and said first set of word lines forms the even-numbered word lines of the semiconductor device, and said second set of word lines form the odd-numbered word lines of the semiconductor device.

9. The semiconductor device of claim 5, wherein said first set of bit lines and said second set of bit lines are alternately disposed on the substrate, and said first set of bit lines forms the even-numbered bit lines of the semiconductor device, and said second set of bit lines form the odd-numbered bit lines of the semiconductor device.

* * * * *